United States Patent
Okazaki et al.

(10) Patent No.: US 6,476,482 B1
(45) Date of Patent: Nov. 5, 2002

(54) CHIP-SIZE INTEGRATED CIRCUIT PACKAGE HAVING SLITS FORMED IN AN INSULATOR TAPE

(75) Inventors: Shohei Okazaki; Yoshihiro Matsumoto, both of Tokyo (JP)

(73) Assignee: NEC Corporation, Tokyo (JP)

( * ) Notice: Subject to any disclaimer, the term of this patent is extended or adjusted under 35 U.S.C. 154(b) by 100 days.

(21) Appl. No.: 09/588,189

(22) Filed: Jun. 7, 2000

(30) Foreign Application Priority Data

Jun. 8, 1999 (JP) ............................. 11-160822

(51) Int. Cl.⁷ ..................... H01L 23/12; H01L 23/053
(52) U.S. Cl. ..................... 257/701; 257/774; 257/784; 257/734
(58) Field of Search ..................... 257/774, 784, 257/786, 700, 701, 758, 762, 775, 737, 738, 734, 666, 668

(56) References Cited

U.S. PATENT DOCUMENTS

| | | | | |
|---|---|---|---|---|
| 5,212,402 A | * | 5/1993 | Higgins, III | 257/532 |
| 5,357,400 A | * | 10/1994 | Takekawa | 174/254 |
| 5,362,984 A | * | 11/1994 | Konda et al. | 257/666 |
| 5,554,885 A | * | 9/1996 | Yamasaki et al. | 257/666 |
| 5,686,757 A | * | 11/1997 | Urushima | 257/668 |
| 5,704,593 A | * | 1/1998 | Honda | 257/668 |
| 5,757,068 A | * | 5/1998 | Kata et al. | 257/668 |
| 5,760,469 A | | 6/1998 | Higashiguchi et al. | |
| 6,028,358 A | | 2/2000 | Suzuki | |
| 6,100,581 A | * | 8/2000 | Wakefield et al. | 257/692 |
| 6,274,405 B1 | * | 8/2001 | Hashimoto | 257/669 |
| 6,313,526 B1 | * | 11/2001 | Nakamura | 206/714 |

FOREIGN PATENT DOCUMENTS

| | | |
|---|---|---|
| JP | 8-306739 A | 11/1996 |
| JP | 9-45809 A | 2/1997 |
| JP | 9-321073 A | 12/1997 |
| JP | 10-340925 A | 12/1998 |
| JP | 2000-31630 A | 1/2000 |

* cited by examiner

*Primary Examiner*—Elvin Enad
*Assistant Examiner*—Kyung S. Lee
(74) *Attorney, Agent, or Firm*—Foley & Lardner

(57) ABSTRACT

In a chip-size package, an insulator tape is formed with a conductive wire having a wider section which is greater in width than other sections of the wire and a conductive bump connected to the wider section of the wire. The insulator tape is further formed with a first plurality of slits arranged on one side of the wider section of the wire and a second plurality of slits arranged on the other side of the wider section. An integrated circuit chip is provided having a conductive pad connected to the copper bump.

18 Claims, 4 Drawing Sheets

CHIP-SIZE INTEGRATED CIRCUIT PACKAGE HAVING SLITS FORMED IN AN INSULATOR TAPE

BACKGROUND OF THE INVENTION

1. Field of the Invention

The present invention relates generally to semiconductor integrated circuit packages and more specifically to chip-size package (CSP) structures.

2. Description of the Related Art

In a prior art CSP structure, shown in FIGS. 1 and 2, a copper wire 12 is patterned on the base 14a of a polyimide tape 14b and partially covered with edges of the tape 14b. Copper wire 12 has a portion having a greater width than the rest. Base 14a is perforated by a laser beam to create a hole beneath the copper wire 12 and the hole is then electroplated to form a copper bump 11 that extends below the wider section of the copper wire 12. These elements are the upper structure of the chip-size package and constitute what is known as an interposer tape for interconnecting external circuitry and an integrated circuit which forms the lower structure of the chip-size package. The bottom surface of the copper bump 11 has a gold-plated layer 16. A chip-size packet is formed when the polyimide base 14a is secured by an adhesive layer 15 to a silicon substrate 18 of an integrated circuit chip and the gold-plated layer 16 is brought into contact with an aluminum pad 17 of the integrated circuit chip. A gold-aluminum contact is thus established between the copper bump 11 and the substrate 18 by application of heat and pressure so that the integrated circuit chip has access to external circuitry. Since silicon and polyimide have different values of thermal expansion coefficient, the application of heat produces a mechanical stress that causes the aluminum pad to be misaligned with the copper bump 11 as indicated by a dotted line 17'. This is undesirable from the viewpoint of product yield and reliability.

SUMMARY OF THE INVENTION

It is therefore an object of the present invention to provide a chip-size package structure of high reliability that can be manufactured at high yield and a method of fabricating the chip-size package structure.

According to a first aspect of the present invention, there is provided a chip-size package comprising an insulator tape formed with a conductive wire having a wider section which is greater in width than other sections of the wire and a conductive bump connected to the wider section of the wire, the tape being formed with a first plurality of slits arranged on one side of the wider section and a second plurality of slits arranged on the other side of the wider section. An integrated circuit chip is provided having a conductive pad connected to the copper bump.

According to a second aspect, the present invention provides a method of fabricating a chip-size package comprising the steps of forming a conductive wire on an insulator tape, the wire having a wider section which is greater in width than other sections of the wire and a conductive bump connected to the wider section of the wire, forming, in the insulator tape, a first plurality of slits arranged on one side of the wider section and a second plurality of slits arranged on the other side of the wider section, securing the insulator tape to an integrated circuit chip having a conductive pad thereon, and pressure contacting the copper bump to the conductive pad while applying heat thereto.

BRIEF DESCRIPTION OF THE DRAWINGS

The present invention will be described in further detail with reference to the accompanying drawings, in which.

DETAILED DESCRIPTION

Figure 1:
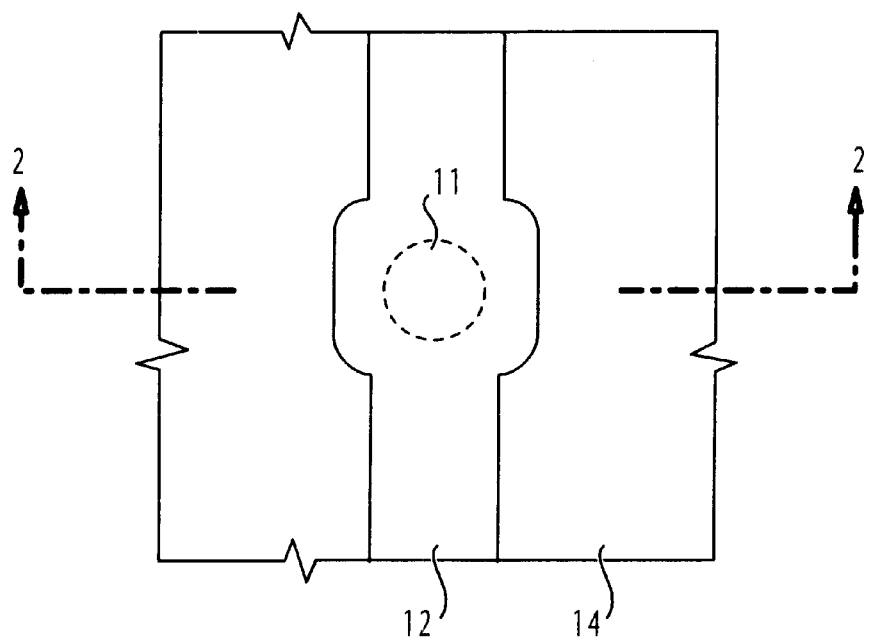
FIG. 1 is a top plan view of a portion of a prior art chip-size package (CSP) structure.
Figure 2:
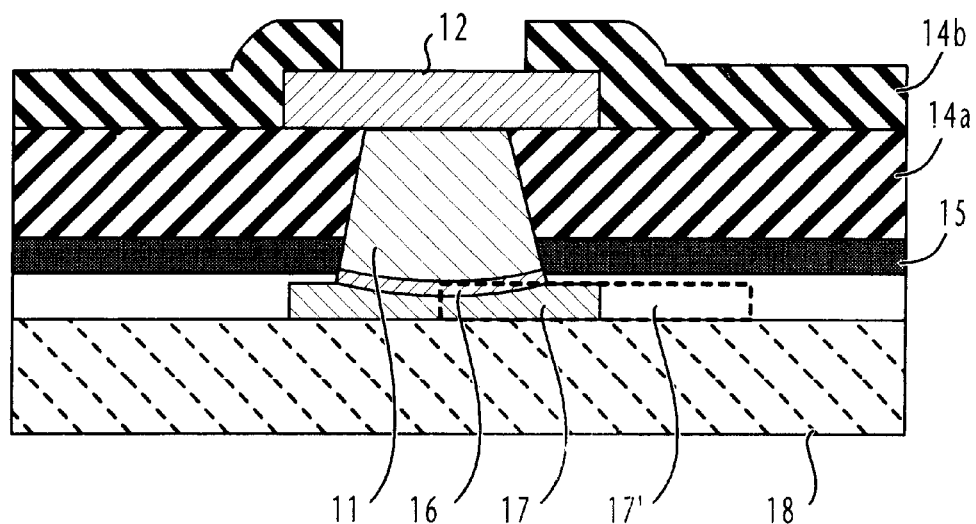
FIG. 2 is a cross-sectional view taken along the line 2—2 of FIG. 1.
Figure 3:
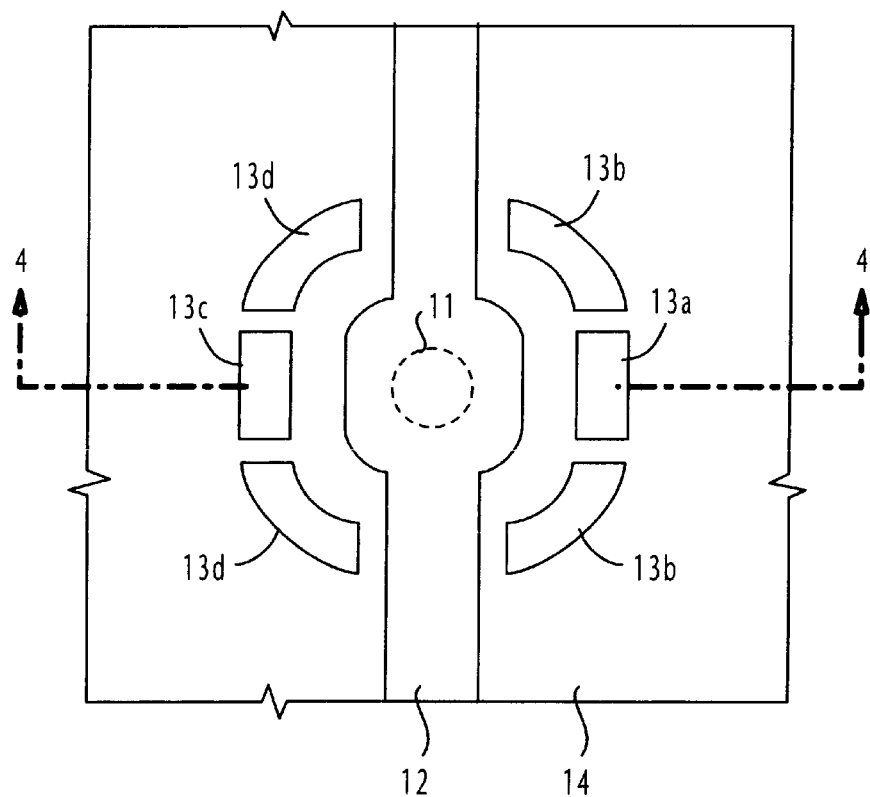
FIG. 3 is a top plan view of a portion of a CSP structure according to the present invention.
Figure 4:
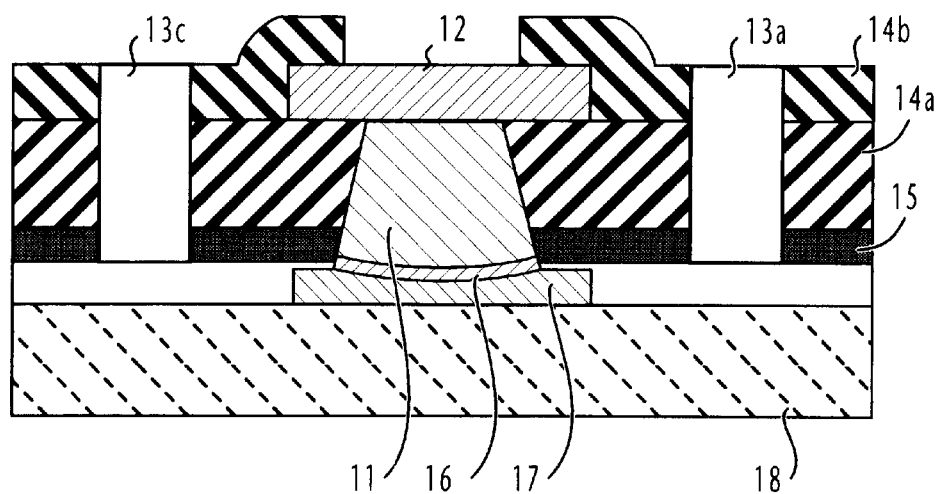
FIG. 4 is a cross-sectional view taken along the line 4—4 of FIG. 3.

Referring to FIGS. 3 and 4, a chip-size package (CSP) structure of the present invention is illustrated, in which same numerals are used to designate elements corresponding to those of FIGS. 1 and 2. According to this invention, the polyimide tape 14b and its base 14a that constitute an interposer tape, are formed with a first plurality of slits 13a, 13b and a second plurality of slits 13c, 13d in positions surrounding the copper bump 11. Slits 13a and 13c are of rectangular shape and slits 13b, 13d are of partcircular shape. All slits 13 are arranged so that they generally delineate a circle about the center of the copper bump 11. On each side of the copper wire 12, each rectangular slit 13a (13c) is parallel to the wider section of copper wire 12 and two part-circular slits 13b (13d) are located adjacent to portions of the wire 12 where the width of the wire varies. The length of each slit 13 and the length of each non-slitted portion between successive slits 13 are determined so that they impart appropriate flexibility and structural strength to the upper structure of the chip-size package. In a practical aspect, each of the slits 13 has a width in the range between 40 and 80 micrometers. If the maximum width of the bottom of the bump 11 is 40 micrometers, the preferred value of the width of each slit is about 40 micrometers. These slots are formed by laser-machining or other suitable method when the polyimide tape is patterned.

Figure 5:
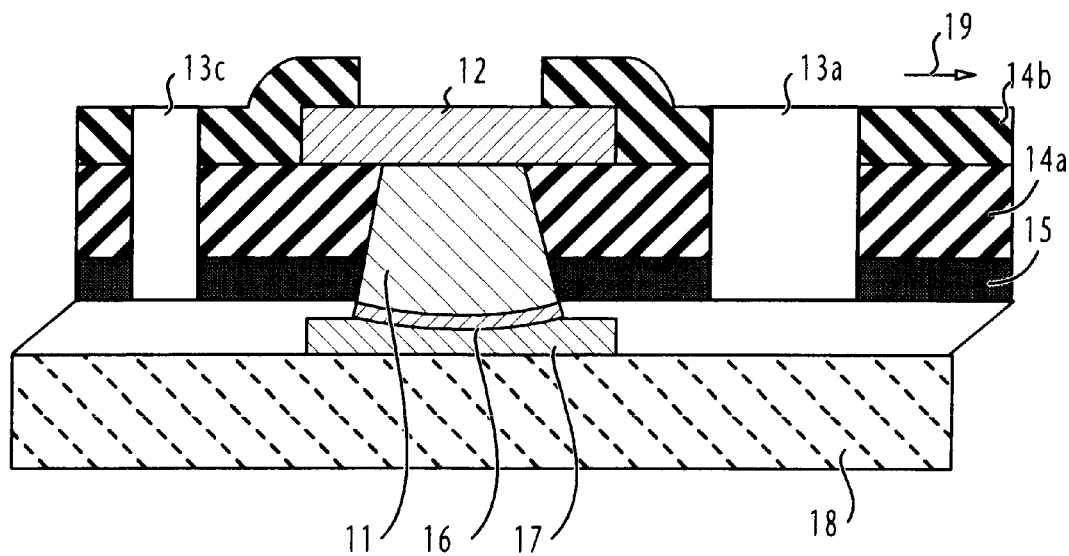
FIG. 5 is a cross-sectional view of the chip-size package of the present invention when the package is subjected to heat and pressure, the upper sub-structure of package is horizontally displaced, while the copper bump maintains contact with the lower sub-structure due to flexibility provided by slits formed around the copper bump.

Slits 13 impart flexibility to the upper polyimide structure, so that it can move horizontally with respect to the underlying structure 18. Therefore, due to the different coefficient of thermal expansion between polyimide and silicon, when heat is applied to the package, the upper polyimide structure may be caused to move to the right relative to the underlying structure as indicated by the arrow 19 in FIG. 5. When this occurs, the copper bump 11 and its surrounding structure maintains their position with respect to the underlying structure 18.

Figure 6:
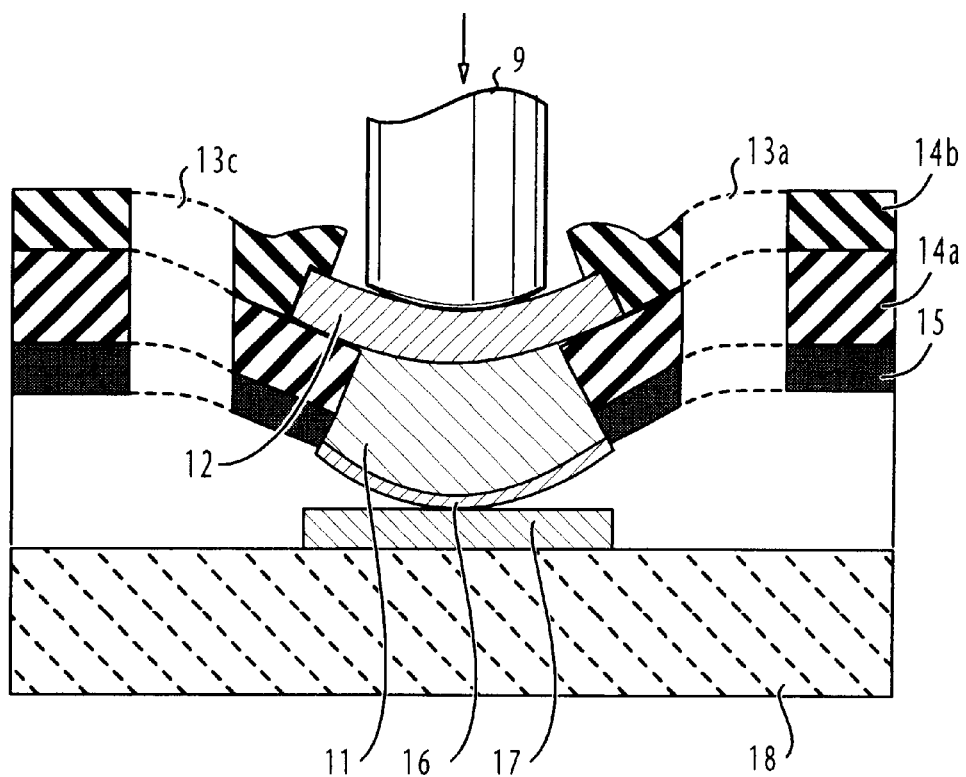
FIG. 6 is a cross-sectional view of the chip-size package of the present invention when the polyimide structure is deformed under mechanical stress produced when the copper bump is engaged with a pad on the integrated circuit chip due to flexibility provided by slits formed around the copper bump.

When the copper bump 11 is connected to the aluminum pad 17 using a pressure tool 9 under heat, the upper polyimide structure may be deformed in a somewhat exaggerated manner as shown in FIG. 6. However, the flexibility of the upper structure alleviates the mechanical stress caused by the application of pressure by pressure tool 9, and hence the deformation of the surrounding part of copper bump 11 can be reduced.

Figure 7:
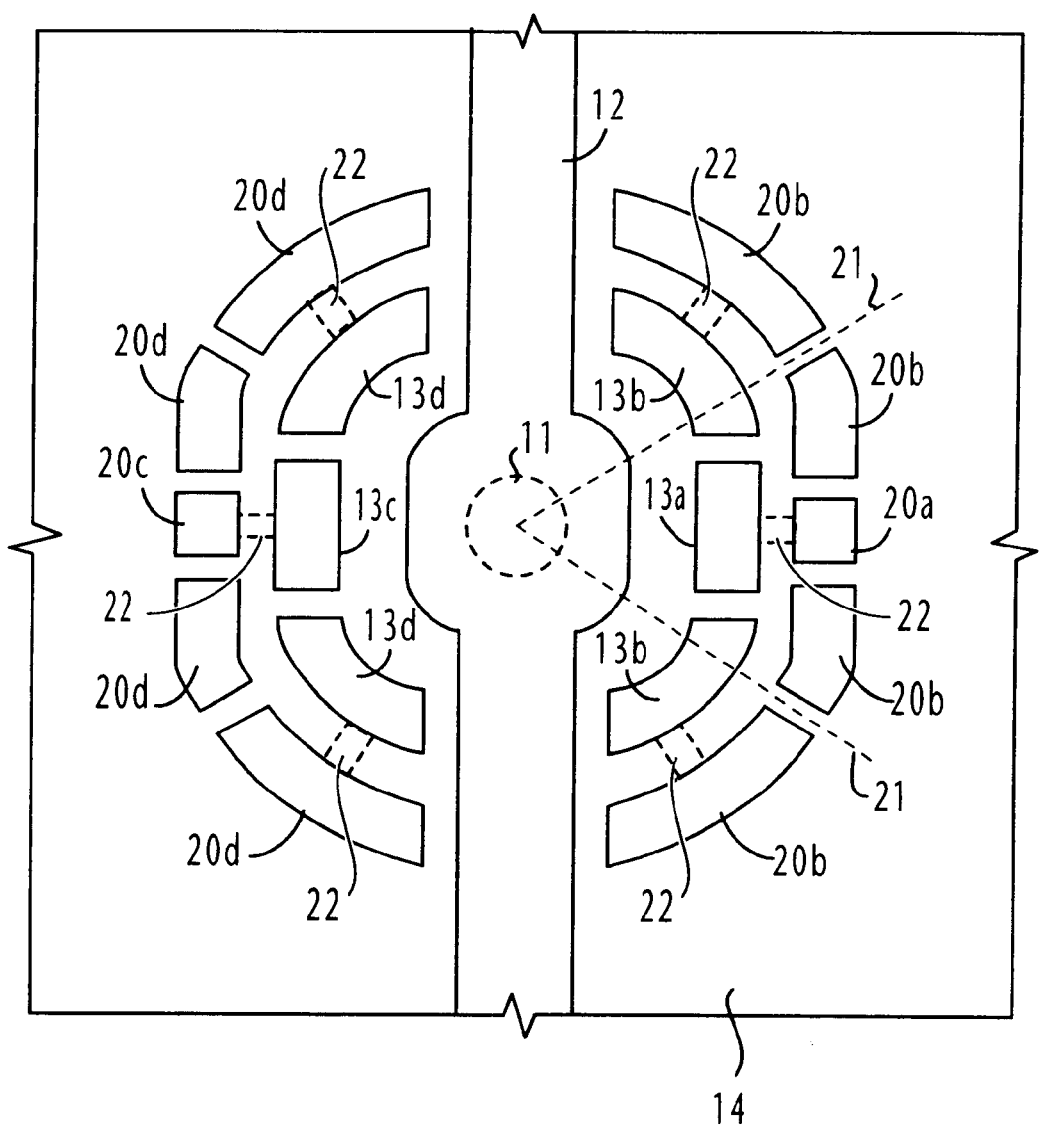
FIG. 7 is a top plan view of a portion of a CSP structure according to a modified embodiment of the present invention.

The chip-size package of the present invention may be modified as shown in FIG. 7 in which inner slits 13 and outer slits 20 are formed in the polyimide structure. Slits 13 are arranged in an inner circle about the center of the copper bump 11 and slits 20 are arranged in an outer circle coaxial to the inner circle. On each side of the copper wire 12, the inner slits 13 have at least one rectangular slit 13a (13c) parallel to the wider section of copper wire 12 and two part-circular slits 13b (13d) located adjacent to portions of the wire 12 where its width varies, and the outer slits 20 have one rectangular slit 20a (20c) parallel to the wider section of copper wire 12 and four part-circular slits 20b (20d) adjacent to the part-circular slits 13b (13d). As in the previous embodiment, in each of the inner and outer circles, the length of each slit and the length of each non-slitted portion are determined to impart flexibility and structural strength to the upper structure of the chip-size package. Additionally, to ensure adequate structural strength, the non-slitted portions of the outer circle are not aligned with the non-slitted portions of the inner circle along radial lines 21 that emanate from the center of the copper bump 11.

Further, portions 22 between the inner slits 13 and adjacent outer slits 20 may be structurally strengthened by ribs having a thickness greater than that of the base layer 14a.

What is claimed is:

1. A chip-size package comprising:
    an insulator tape having a conductive wire, the conductive wire having a wider section that is greater in width than other sections of the wire;
    a conductive bump connected to the wider section of the wire; and
    an integrated circuit chip having a conductive pad connected to said conductive bump,
    wherein the tape has a first plurality of slits arranged adjacent to a first side of the wider section of the wire and a second plurality of slits arranged adjacent to a second side of the wider section of the wire, the first plurality of slits and the second plurality of slits reducing the effects of deformation of the tape on the connection of the conductive bump to the conductive pad of the integrated circuit chip.

2. A chip-size package as claimed in claim 1, wherein each of said slits has a width in the range between 40 and 80 micrometers.

3. A chip-size package as claimed in claim 1, wherein said first plurality of slits include a plurality of part-circular slits located adjacent a portion of said conductive wire where the width of the wire varies and wherein said second plurality of slits include a plurality of part-circular slits located adjacent a portion of said conductive wire where the width of the wire varies.

4. A chip-size package as claimed in claim 3, wherein said first plurality of slits further include at least one rectangular slit parallel to said wider section of the wire and wherein said second plurality of slits include at least one rectangular slit parallel to said wider section of the wire.

5. A chip-size package as claimed in claim 1, wherein said insulator tape is further formed with a third plurality of slits located outside of said first plurality of said slits and a fourth plurality of slits located outside of said second plurality of said slits.

6. A chip-size package as claimed in claim 3, wherein said insulator tape is further formed with a third plurality of slits located outside of said first plurality of said slits and a fourth plurality of slits located outside of said second plurality of said slits, and
    wherein said third plurality of slits include a plurality of part-circular slits located adjacent said part-circular slits of the first plurality of slits, and wherein said fourth plurality of slits include a plurality of part-circular slits located adjacent said part-circular slits of the second plurality of slits.

7. A chip-size package as claimed in claim 6, wherein said third plurality of slits further include at least one rectangular slit parallel to said wider section of the wire and wherein said fourth plurality of slits include at least one rectangular slit parallel to said wider section of the wire.

8. A chip-size package as claimed in claim 5, wherein said first plurality of slits are spaced apart from each other by non-slitted portions and said third plurality of slits are spaced apart from each other by non-slitted portions which are not radially aligned with the non-slitted portions of the first plurality of slits and wherein said second plurality of slits are spaced apart from each other by non-slitted portions and said fourth plurality of slits are spaced apart from each other by non-slitted portions which are not radially aligned with the non-slitted portions of the second plurality of slits.

9. A chip-size package as claimed in claim 1, wherein said insulator tape is formed with structurally strengthened portions between said first plurality of slits and said third plurality of slits and between said second plurality of slits and said fourth plurality of slits.

10. A method of fabricating a chip-size package comprising the steps of:
    forming a conductive wire on an insulator tape, said wire having a wider section that is greater in width than other sections of the wire, and the wire having a conductive bump connected to the wider section of the wire;
    forming, in said insulator tape, a first plurality of slits arranged adjacent to a first side of said wider section of the wire and a second plurality of slits arranged adjacent to a second side of the wider section of the wire;
    securing said insulator tape to an integrated circuit chip having a conductive pad thereon; and
    pressure contacting said conductive bump to said conductive pad while applying heat thereto,
    the first plurality of slits and the second plurality of slits reducing the effects of deformation of the tape on the connection of the conductive bump to the conductive pad of the integrated circuit.

11. The method of claim 10, wherein each of said slits has a width in the range between 40 and 80 micrometers.

12. The method of claim 10, wherein said first plurality of slits include a plurality of part-circular slits located adjacent a portion of said conductive wire where the width of the wire varies and wherein said second plurality of slits include a plurality of part-circular slits located adjacent a portion of said conductive wire where the width of the wire varies.

13. The method of claim 12, wherein said first plurality of slits further include at least one rectangular slit parallel to said wider section of the wire and wherein said second plurality of slits include at least one rectangular slit parallel to said wider section of the wire.

14. The method of claim 10, further comprising the steps of forming in said insulator tape a third plurality of slits located outside of said first plurality of said slits and a fourth plurality of slits located outside of said second plurality of said slits.

15. The method of claim 12, further comprising forming in said insulator tape a third plurality of slits located outside of said first plurality of said slits and a fourth plurality of slits located outside of said second plurality of said slits, and wherein said third plurality of slits include a plurality of part-circular slits located adjacent said part-circular slits of the first plurality of slits, and wherein said fourth plurality of slits include a plurality of part-circular slits located adjacent said part-circular slits of the second plurality of slits.

16. The method of claim 15, wherein said third plurality of slits further include at least one rectangular slit parallel to said wider section of the wire and wherein said fourth plurality of slits include at least one rectangular slit parallel to said wider section of the wire.

17. The method of claim 14, wherein said first plurality of slits are spaced apart from each other by non-slitted portions and said third plurality of slits are spaced apart from each other by non-slitted portions which are not radially aligned with the non-slitted portions of the first plurality of slits, and wherein said second plurality of slits are spaced apart from each other by non-slitted portions and said fourth plurality of slits are spaced apart from each other by non-slitted portions which are not radially aligned with the non-slitted portions of the second plurality of slits.

18. The method of claim 10, further comprising the step of forming in said insulator tape structurally strengthened portions between said first plurality of slits and said third plurality of slits and between said second plurality of slits and said fourth plurality of slits.

* * * * *